(12) United States Patent
Das et al.

(10) Patent No.: US 7,883,949 B2
(45) Date of Patent: Feb. 8, 2011

(54) METHODS OF FORMING SILICON CARBIDE SWITCHING DEVICES INCLUDING P-TYPE CHANNELS

(75) Inventors: Mrinal Kanti Das, Durham, NC (US); Qingchun Zhang, Cary, NC (US); Sei-Hyung Ryu, Farmington Hills, MI (US)

(73) Assignee: Cree, Inc, Durham, NC (US)

( * ) Notice: Subject to any disclaimer, the term of this patent is extended or adjusted under 35 U.S.C. 154(b) by 490 days.

(21) Appl. No.: 11/740,687

(22) Filed: Apr. 26, 2007

(65) Prior Publication Data

US 2008/0001158 A1 Jan. 3, 2008

Related U.S. Application Data

(60) Provisional application No. 60/817,296, filed on Jun. 29, 2006.

(51) Int. Cl.
*H01L 21/337* (2006.01)
(52) U.S. Cl. .................. 438/194; 438/285; 438/522; 438/931; 257/E21.043
(58) Field of Classification Search ............... 438/194, 438/285, 522, 931; 257/E21.043
See application file for complete search history.

(56) References Cited

U.S. PATENT DOCUMENTS 5,506,421 A    4/1996   Palmour (Continued)

FOREIGN PATENT DOCUMENTS

EP    0 372 412 A1    6/1990
EP    1 361 614 A1    11/2003

OTHER PUBLICATIONS

Thomas et al., "Annealing of Ion Implantation Damage in SiC Using a Graphite Mask", Material Research Society Symposium Y Proceedings vol. 572, Spring 1999, pp. 45-50.*

(Continued)

*Primary Examiner*—Zanda Smith
*Assistant Examiner*—Christy L Novacek
(74) *Attorney, Agent, or Firm*—Myers, Bigel, Sibley & Sajovec, P.A.

(57) ABSTRACT

Methods of forming a p-channel MOS device in silicon carbide include forming an n-type well in a silicon carbide layer, and implanting p-type dopant ions to form a p-type region in the n-type well at a surface of the silicon carbide layer and at least partially defining a channel region in the n-type well adjacent the p-type region. A threshold adjustment region is formed in the channel region. The implanted ions are annealed in an inert atmosphere at a temperature greater than 1650° C. A gate oxide layer is formed on the channel region, and a gate is formed on the gate oxide layer. A silicon carbide-based transistor includes a silicon carbide layer, an n-type well in the silicon carbide layer, and a p-type region in the n-type well at a surface of the silicon carbide layer and at least partially defining a channel region in the n-type well adjacent the p-type region. A threshold adjustment region is in the channel region and includes p-type dopants at a dopant concentration of about $1\times10^{16}$ cm$^{-3}$ to about $5\times10^{18}$ cm$^{-3}$. The transistor further includes a gate oxide layer on the channel region, and a gate on the gate oxide layer. The transistor may exhibit a hole mobility in the channel region in excess of 5 cm$^2$/V-s at a gate voltage of −25V.

20 Claims, 8 Drawing Sheets

U.S. PATENT DOCUMENTS

| | | | |
|---|---|---|---|
| 5,776,837 A | | 7/1998 | Palmour |
| 5,972,801 A | | 10/1999 | Lipkin et al. |
| 6,344,663 B1 | * | 2/2002 | Slater et al. .................. 257/77 |
| 6,388,271 B1 | | 5/2002 | Mitlehner et al. |
| 6,610,366 B2 | | 8/2003 | Lipkin |
| 7,528,040 B2 | * | 5/2009 | Das et al. .................... 438/268 |
| 2004/0211980 A1 | * | 10/2004 | Ryu ........................... 257/200 |
| 2005/0139936 A1 | | 6/2005 | Li |
| 2008/0105949 A1 | * | 5/2008 | Zhang et al. ................ 257/584 |

OTHER PUBLICATIONS

Bhatnagar et al., "Comparison of 6H—SiC, 3C—SiC and Si for Power Devices," *IEEE Transactions on Electron Devices*, vol. 40, 1993, pp. 645-655.

Invitation to Pay Additional Fees for PCT/US2007/010192; Oct. 29, 2007.

Panknin et al. "Electrical and microstructural properties of highly boron-implantation doped 6H-SiC" *Journal of Applied Physics* 89(6):3162-3166 (2001).

Rao et al. "Maturing ion-implantation technology and its device applications inSiC" *Solid-State Electronics* 47:213-222 (2003).

Rao et al. "Silane overpressure post-implant annealing of Al dopants in SiC: Cold wall CVD apparatus" *Applied Surface Science* 252:3837-3842 (2006).

International Preliminary Report on Patentability (9 pages) corresponding to International Application No. PCT/US2007/010192; Mailing Date: Sep. 23, 2008.

* cited by examiner

1700 °C

1800 °C

METHODS OF FORMING SILICON CARBIDE SWITCHING DEVICES INCLUDING P-TYPE CHANNELS

CROSS-REFERENCE TO RELATED APPLICATION AND CLAIM OF PRIORITY

This application claims the benefit of and priority to U.S. Provisional Patent Application No. 60/817,296, filed Jun. 29, 2006, entitled "SILICON CARBIDE SWITCHING DEVICES INCLUDING P-TYPE CHANNELS AND METHODS OF FORMING THE SAME," the disclosure of which is hereby incorporated herein by reference as if set forth in its entirety.

STATEMENT OF U.S. GOVERNMENT INTEREST

This invention was made with Government support under Contract No. N00014-05-C-0202 awarded by ONR/DARPA. The Government may have certain rights in the invention.

FIELD OF THE INVENTION

The present invention relates to silicon carbide electronic devices. More particularly, the present invention relates to silicon carbide electronic devices including metal-oxide-semiconductor structures.

BACKGROUND

Power semiconductor devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region.

Recent development efforts in power devices have also included investigation of the use of silicon carbide (SiC) devices for power devices. Silicon carbide (SiC) has a combination of electrical and physical properties that make it attractive for a semiconductor material for high temperature, high voltage, high frequency and high power electronic devices. These properties include a 3.0 eV bandgap, a 4 MV/cm electric field breakdown, a 4.9 W/cm-K thermal conductivity, and a $2.0 \times 10^7$ cm/s electron drift velocity.

Consequently, these properties may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "Comparison of 6H—SiC, 3C—SiC and Si for Power Devices", IEEE Transactions on Electron Devices, Vol. 40, 1993, pp. 645-655. A power MOSFET fabricated in silicon carbide is described in U.S. Pat. No. 5,506,421 to Palmour entitled "Power MOSFET in Silicon Carbide" and assigned to the assignee of the present invention.

In order to implement a p-channel metal-oxide-semiconductor (MOS) type device, such as an PMOS transistor or a p-channel insulated gate bipolar transistor (P-IGBT) in silicon carbide, it is desirable to provide a high quality MOS channel that is suitable for hole conduction. Typical p-channel MOS devices in silicon carbide have demonstrated unacceptably low hole mobility. It is estimated that a mobility of at least 5 $cm^2$/V-s may be desirable in order for the performance of a P-IGBT to match that of a conventional DMOSFET device having a 10 kV blocking voltage.

SUMMARY

Some embodiments of the invention provide methods of forming a p-channel MOS device in silicon carbide. The methods include forming an n-type well in a silicon carbide layer, and implanting p-type dopant ions to form a p-type region in the n-type well. The p-type region at least partially defines a channel region in the n-type well. The methods further include forming a threshold adjustment region in the channel region, and annealing the implanted ions in an inert atmosphere at a temperature greater than 1650° C. A gate oxide layer is formed on the channel region, and a gate contact is formed on the gate oxide layer.

The methods may further include forming a graphite coating on the silicon carbide layer after implanting the p-type dopant ions. Annealing the implanted ions may include annealing the silicon carbide layer and the graphite coating. The graphite coating is removed after annealing the implanted ions. The graphite coating may be crystallized before annealing the implanted ions, and may have a thickness of about 1 μm. Annealing the implanted ions may include annealing the implanted ions at a temperature greater than 1700° C., and in some embodiments greater than 1800° C.

Forming the gate oxide layer may include forming the gate oxide layer in dry $O_2$, and the methods may further include annealing the gate oxide layer in wet $O_2$. In particular, the gate oxide layer may be formed in dry $O_2$ at a temperature of up to about 1200° C. The wet anneal may include a pyrogenic anneal with a molecular ratio of hydrogen to oxygen of about 1.8 or more.

The methods may further include annealing the gate oxide layer in an inert atmosphere at a temperature of up to about 1200° C. after forming the gate oxide layer and before annealing the gate oxide layer in wet $O_2$.

In some embodiments, annealing the gate oxide layer in wet $O_2$ may include annealing the gate oxide layer in wet $O_2$ at a temperature of less than about 950° C. for at least one hour.

In some embodiments, the silicon carbide layer may include an n-type silicon carbide layer, and the p-type region may include a p-type source region. The methods may further include implanting p-type dopant ions in the n-type well to form a p-type drain region spaced apart from the p-type source region and defining the channel region between the p-type source region and the p-type drain region.

In some embodiments, the silicon carbide layer may include a p-type silicon carbide layer including a JFET region adjacent to the n-type well, and the p-type region may include a p-type emitter region spaced apart from the JFET region and defining the channel region between the p-type emitter region and the JFET region.

The methods may further include forming a threshold adjustment region between the source and drain regions. Forming the threshold adjustment region may include implanting p-type dopant ions into the channel region to adjust a threshold of the channel region. The p-type dopants may be implanted at a dose of about $5 \times 10^{11}$ cm$^{-2}$ to about $5 \times 10^{13}$ cm$^{-2}$ and/or at an implant energy of at least about 25 keV.

In some embodiments, the threshold adjustment region may be formed by forming an epitaxial layer on the silicon carbide layer and doping the epitaxial layer with a p-type dopant. Forming the p-type region may include implanting p-type dopant ions into the epitaxial layer.

Forming the epitaxial layer may include doping the epitaxial layer with donor ions at a doping concentration of about $5 \times 10^{15}$ cm$^{-3}$ to about $1 \times 10^{16}$ cm$^{-3}$ during epitaxial growth, and then implanting p-type dopant ions into the epitaxial layer to provide a net doping concentration of about $1 \times 10^{16}$ cm$^{-3}$ to about $5 \times 10^{18}$ cm$^{-3}$ in the epitaxial layer. The epitaxial layer may have a thickness of about 100 nm to about 500 nm.

A silicon carbide-based transistor according to some embodiments of the invention includes a silicon carbide layer, an n-type well in the silicon carbide layer, and a p-type region in the n-type well and at least partially defining a channel region in the n-type well adjacent the p-type region. The transistor further includes a threshold adjustment region in the channel region. The threshold adjustment region includes p-type dopants at a net dopant concentration of about $1 \times 10^{16}$ cm-3 to about $5 \times 10^{18}$ cm$^{-3}$. The transistor further includes a gate oxide layer on the channel region, and a gate on the gate oxide layer. The channel region may have a hole mobility of at least about 5 cm$^2$/V-s at a gate voltage of –25V.

In some embodiments, the silicon carbide layer may include an n-type silicon carbide layer, and the p-type region may include a p-type source region. The transistor may further include a p-type drain region spaced apart from the p-type source region and defining the channel region between the p-type source region and the p-type drain region.

In some embodiments, the silicon carbide layer may include a p-type silicon carbide layer including a JFET region adjacent to the n-type well, and the p-type region may include a p-type emitter region spaced apart from the JFET region and defining the channel region between the p-type emitter region and the JFET region.

The threshold adjustment region may include an implanted region in the n-type well and/or an epitaxial layer on the n-type silicon carbide layer. The epitaxial layer may have a thickness of about 100 nm to about 500 nm. In some embodiments, the channel region may have a hole mobility of at least about 10 cm$^2$/V-s at a gate voltage of –25V, and in some embodiments may have a hole mobility of at least about 13 cm$^2$/V-s at a gate voltage of –20V.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
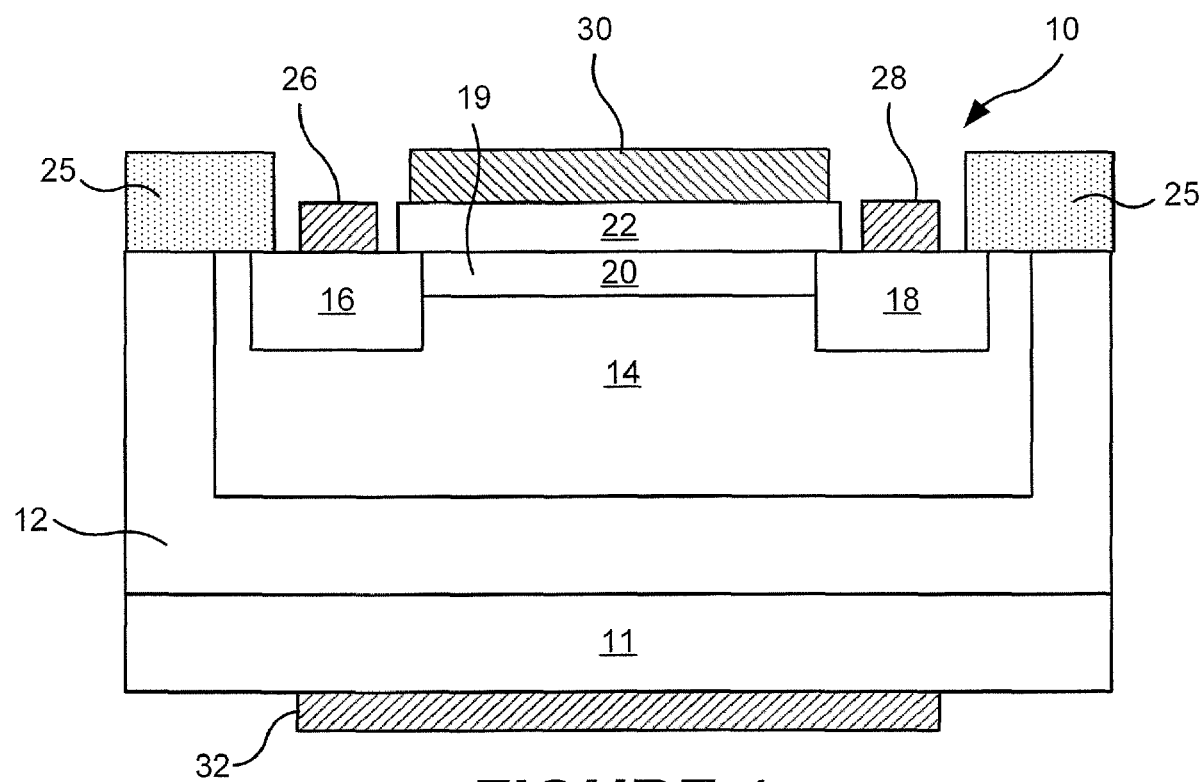
FIG. 1 is a cross-section of a metal-oxide-semiconductor (MOS) device according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Some embodiments of the invention provide a silicon carbide electronic device including a p-type channel region. The channel region of the device may exhibit a hole mobility in excess of 5 $cm^2$/V-s at a gate voltage of −25V, and in some embodiments may exhibit a hole mobility in excess of 10 $cm^2$/V-s at a gate voltage of −25V. The increased hole mobility may be obtained using a dry-wet oxidation process, threshold adjustment, and/or high temperature activation anneals.

A metal oxide semiconductor (MOS) device 10 according to some embodiments of the invention is illustrated in FIG. 1. As shown therein, a substrate 11 is provided that may be, for example, an n-type silicon carbide substrate. The substrate may have a polytype of 2H, 4H, 6H, 3C, and/or 15R. An n-type epitaxial layer 12 is formed on the substrate 11. An n-type well region 14 is formed in the epitaxial layer 12, and spaced apart $p^+$-type source 16 and drain 18 regions are formed in the well region 14 at the surface of the epitaxial layer 12 opposite the substrate 11. Source and drain ohmic contacts 26 and 28 are formed on the source and drain regions 16, 18, respectively.

A channel region 19 extends at or near the surface of the epitaxial layer 12 between the source and drain regions 16, 18. A threshold adjustment region 20 including p-type dopants at a dopant concentration of about $1 \times 10^{16}$ $cm^{-3}$ to about $5 \times 10^{18}$ $cm^{-3}$ is in the channel region 19. A gate oxide layer 22 and a gate 30 are formed on the surface of the epitaxial layer 12 above the channel region 19. A field oxide region 25 is formed over the field region of the device 10. A body contact 32 may be formed on the substrate 11.

Figure 2A:
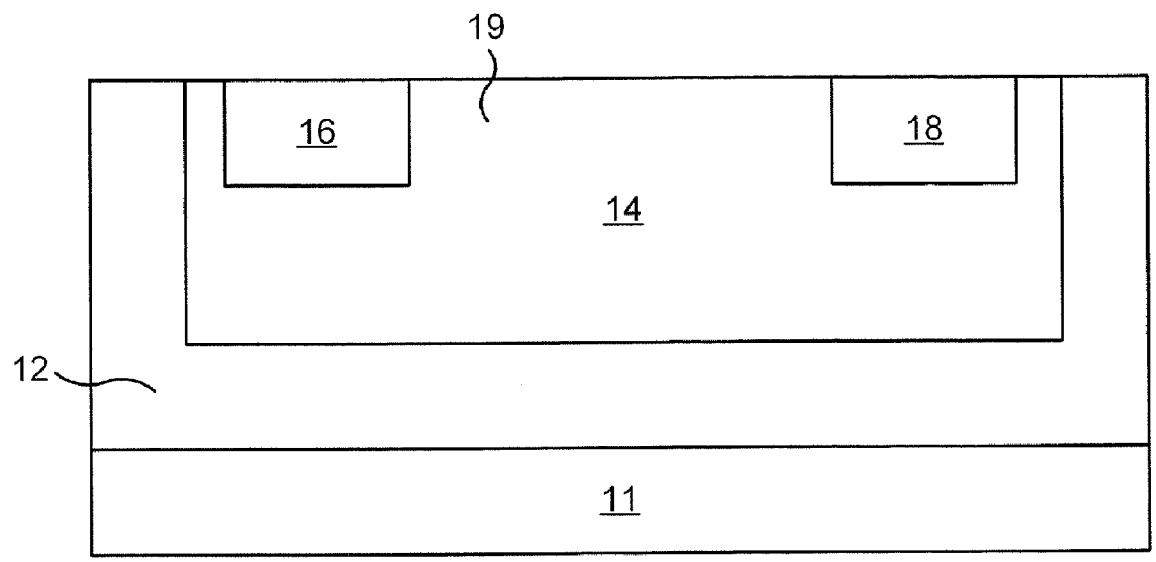
FIGS. 2A-2D are cross-sectional illustrations showing operations associated with formation of devices according to some embodiments of the invention.

Operations for forming the device 10 illustrated in FIG. 1 are illustrated in FIGS. 2A-2D. Referring to FIG. 2A, the epitaxial layer 12 formed on the substrate 11 may include n-type silicon carbide having a net doping concentration of about $5 \times 10^{15}$ $cm^{-3}$ and having a thickness of about 5 µm. The n-type well region 14 is formed, for example via ion implantation, in the epitaxial layer 12. The n-type well region 14 may be doped, for example, with nitrogen and/or phosphorus atoms at a concentration of from about $1 \times 10^{16}$ $cm^{-3}$ to about $5 \times 10^{19}$ $cm^{-3}$. In particular embodiments, the n-type well region 14 may be doped with n-type dopants, such as nitrogen and/or phosphorus, at a concentration of about $5 \times 10^{16}$ $cm^{-3}$. The n-type well region 14 may be formed, for example, via implantation of ions having a total dose of $2.76 \times 10^{14}$ $cm^{-2}$ and an implant energy of 360 keV at a temperature of 650° C. The well region 14 may extend a depth of about 0.5 µm into the epitaxial layer 12.

P-type source and drain regions 16, 18 are formed in the n-type well region 14, for example, by selective implantation of p-type dopants, such as boron and/or aluminum atoms. The source and drain regions 16, 18 may be formed, for example, via implantation of boron or aluminum ions having a total dose of $8.1 \times 10^{14}$ $cm^{-2}$ and an implant energy of 140 keV at a temperature of 650° C. The source and drain regions 16, 18 are spaced apart in the n-type well region 14 to define a channel region 19 therebetween.

Conventional n-channel SiC MOS devices typically have very low threshold voltages (0-2V), which may preclude the use of a threshold adjustment implant in an enhancement mode device. However, a p-channel MOS device may have a large enough threshold voltage to allow the use of a threshold adjustment implant that may increase the mobility of carriers in the channel and/or reduce the threshold voltage.

Figure 2B:
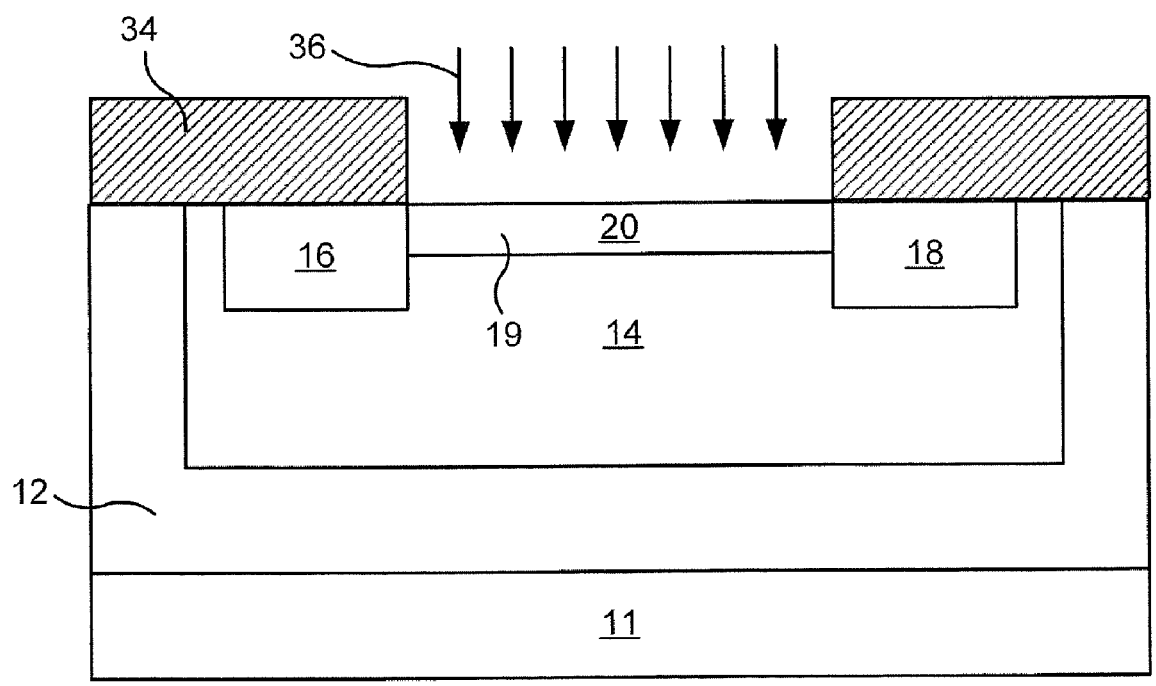

Referring to FIG. 2B, a mask 34 is formed on the surface of the epitaxial layer 12 and patterned to expose the channel region 19 of the device 10. A threshold adjustment implant 36 may be performed in a threshold adjustment region 20 of the channel region 19 in order to adjust the threshold voltage of the device 10. The threshold adjustment implant may be performed with a dose of from about $5 \times 10^{11}$ cm$^{-2}$ to about $5 \times 10^{13}$ cm$^{-2}$ depending on the amount of threshold adjustment required. The resulting threshold adjustment region may have a thickness of about 100 nm to about 500 nm and may have a net dopant concentration of about $1 \times 10^{16}$ cm$^{-3}$ to about $5 \times 10^{18}$ cm$^{-3}$. The species implanted may depend on the type of adjustment required. For example, in order to reduce the threshold voltage of a p-channel device, an acceptor (p-type) ion may be implanted as a p-type dopant. In particular embodiments, a threshold adjustment implant of aluminum may be performed at a dose of $3 \times 10^{12}$ cm$^{-2}$. The implant energy may be selected to position the channel at the surface of the device or at a desired distance from the surface. In some embodiments, the threshold adjustment implant may be performed with an implant energy of at least about 25 keV. In some embodiments, the threshold adjustment may include multiple implants. In particular embodiments, the threshold adjustment may be accomplished by implanting aluminum ions with a dose of $8.4 \times 10^{11}$ cm$^{-2}$ at 45 keV, a dose of $1.12 \times 10^{12}$ cm$^{-2}$ at 85 keV, a dose of $1.52 \times 10^{12}$ cm$^2$ at 140 keV, a dose of $1.92 \times 10^{12}$ cm$^2$ at 210 keV, and a dose of $4.6 \times 10^{12}$ cm$^{-2}$ at 330 keV, for a total aluminum dose of $1 \times 10^{13}$ cm$^{-2}$. Following ion implantation, the mask 34 may be removed.

Figure 2C:
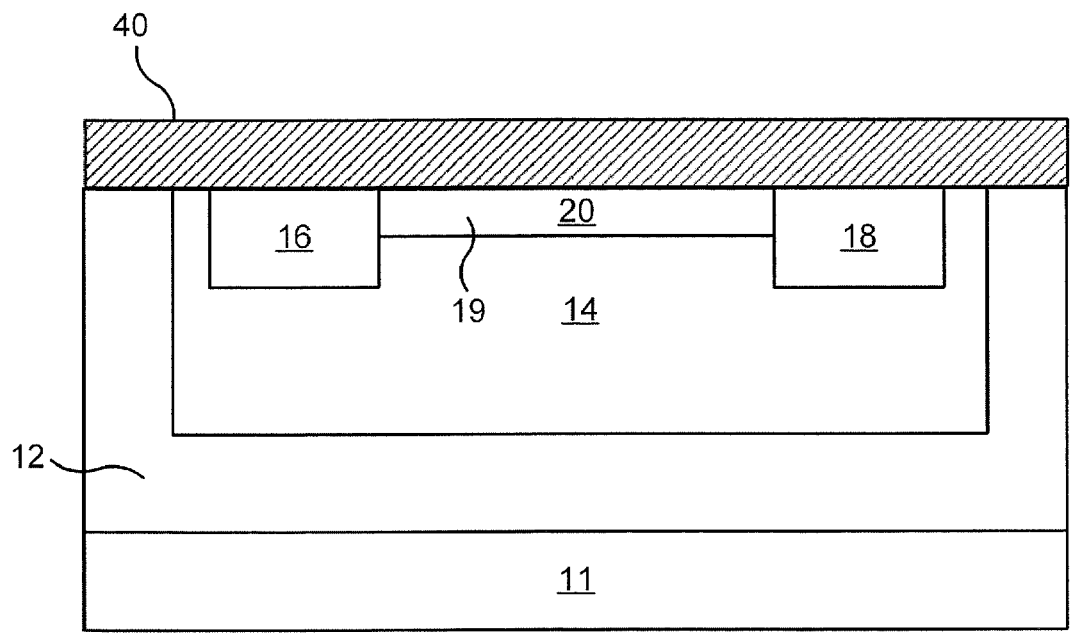

In conjunction with the threshold adjustment, a high temperature activation anneal (1800° C.) may enhance the activation of the threshold adjustment ions, as well as annealing of defects in the channel region 19. Such a high temperature anneal may damage the surface of the silicon carbide epitaxial layer 12. In order to reduce such damage, a graphite coating may be formed on the surface of the epitaxial layer 12. Referring to FIG. 2C, prior to annealing the device to activate the implanted ions, a graphite coating 40 may be applied to the top/front side of the structure in order to protect the surface of the structure during the anneal. The graphite coating 40 may be applied by a conventional resist coating method and may have a thickness of about 1 µm. The graphite coating 40 may be heated to form a crystalline coating on the epitaxial layer 12. The implanted ions may be activated by a thermal anneal that may be performed, for example, in an inert gas at a temperature of about 1700° C. or greater. In particular the thermal anneal may be performed at a temperature of about 1850° C. in argon for 5 minutes. The graphite coating 40 may help to protect the surface of the epitaxial layer 12 during the high temperature anneal.

The graphite coating may then be removed, for example, by ashing and thermal oxidation.

Figure 2D:
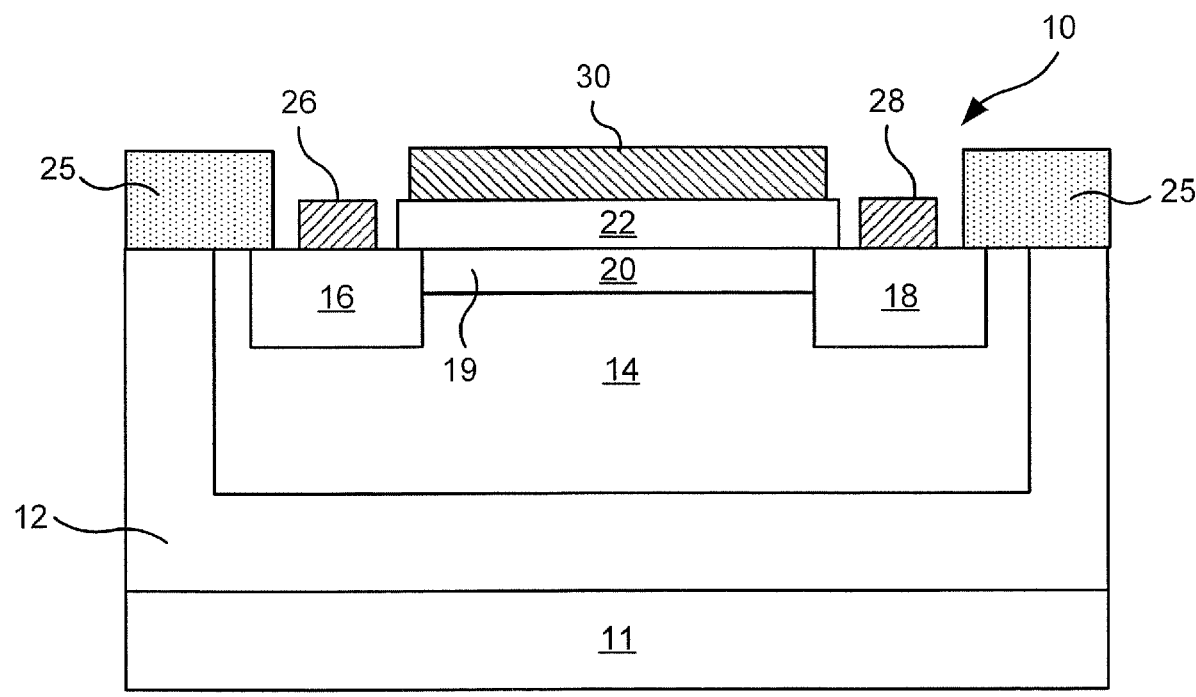

Referring to FIG. 2D, a field oxide 25 including, for example, 5000 Å of high temperature oxide may be deposited, for example by high temperature chemical vapor deposition, to isolate the device 10. The field oxide 25 may be blanket deposited and subsequently patterned to expose the active region of the device 10 including the source region 16, the drain region 18 and the channel region 19.

Following formation of the field oxide 25, a gate oxide 22 is grown on the exposed surface of the epitaxial layer 12. The gate oxide 22 may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz furnace tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used. Higher temperatures may be achieved for the dry $O_2$ growth by using, for example, a silicon carbide furnace instead of a quartz tube. However, higher temperatures may not improve the quality of the oxide.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour.

The wet $O_2$ oxide anneal may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet $O_2$ at a temperature of about 950° C. for about 3 hours. The resulting gate oxide layer 22 may have a thickness of about 500 Å.

Figure 3:
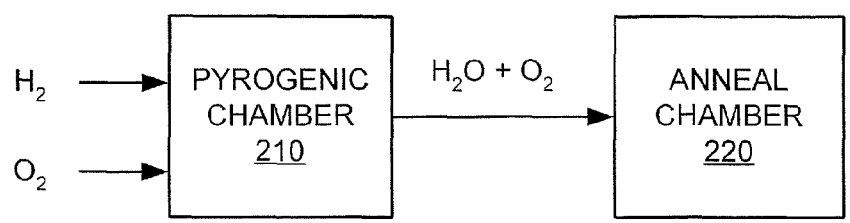
FIG. 3 is a schematic diagram illustrating a pyrogenic chamber and an anneal chamber that may be used according to some embodiments of the invention.

In some embodiments, the steam used in the wet $O_2$ anneal process may be generated using a pyrogenic process, and the resulting wet $O_2$ anneal may be referred to as a "pyrogenic oxidation." Referring to FIG. 3, in a pyrogenic oxidation, oxygen ($O_2$) gas and hydrogen ($H_2$) gas are flowed into a pyrogenic chamber 210, which is separate from the anneal chamber 220, and which is heated to a high temperature, such as about 800° C. The hydrogen and oxygen gas combust in the pyrogenic chamber 210 and form a mixture of steam ($H_2O$) and oxygen ($O_2$), which is supplied to the anneal chamber 220.

In some cases, it may be desirable to adjust the flow rates of hydrogen and oxygen into the pyrogenic chamber 210 so that a molecular ratio of hydrogen to oxygen approaches, but does not exceed, a 2:1 ratio. That is, it may be desirable for the mixture supplied to the anneal chamber 220 to be as wet as possible, within reasonable safety limits. In some cases, a hydrogen/oxygen ratio of 1.8:1 or 1.9:1 may be used.

Figure 9:
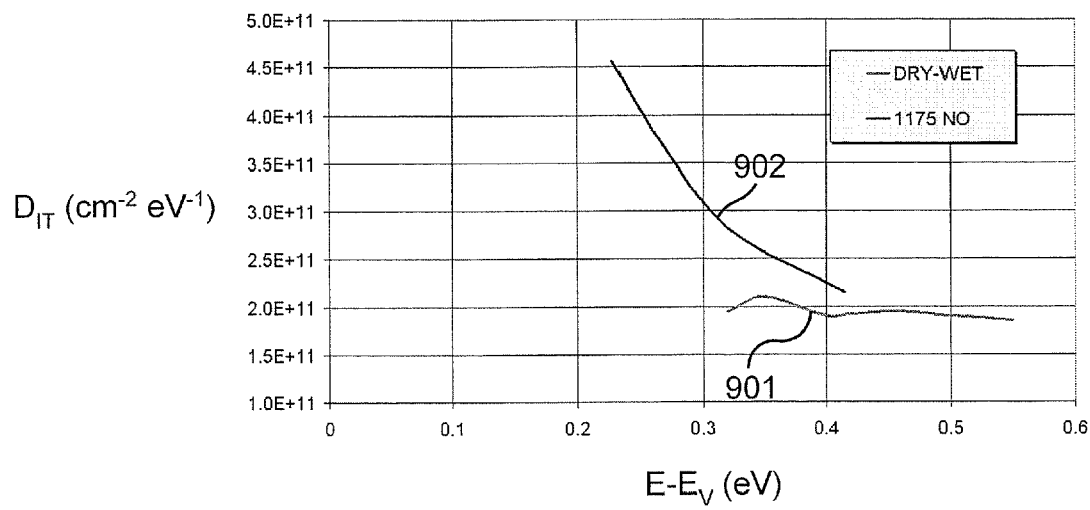
FIG. 9 is a graph of $D_{IT}$ versus energy level for an oxide layer formed according to some embodiments of the invention.

The gate oxide layer 22 may be characterized by a reduced interface state density $D_{IT}$ in the lower half of the bandgap of the oxide layer 22 compared, for example, to a nitrided oxide layer on SiC, or to an oxide layer that is only wet oxidized. For example, FIG. 9 is a graph of $D_{IT}$ versus energy level for SiO$_2$ layers thermally grown on 4H—SiC substrates. An oxide layer grown using a dry-wet oxidation process as described above exhibited low interface state density in the lower half of the bandgap, as shown by curve 901. However, when an oxide layer grown using a dry-wet oxidation process was subsequently annealed at about 1175° C. in an atmosphere containing nitric oxide (NO), the interface state density increased, as shown by curve 902.

Referring again to FIG. 2D, a gate contact 30 is formed on the gate oxide 22. The gate contact 30 may include, for example, polysilicon doped with boron and may have a thickness of about 450 nm.

Source and drain ohmic contacts 26, 28 are formed on the source and drain regions 16, 18, respectively. The source and drain ohmic contacts 26, 28 may include about 50-80 nm of nickel, and may be rapid thermal annealed at about 825° C. for about 2 minutes in an atmosphere of argon.

Conventional n-channel metal oxide semiconductor (MOS) devices in silicon carbide may be improved through nitridation of the gate oxide as described, for example, in U.S.

Pat. No. 6,610,366, the disclosure of which is incorporated herein by reference in its entirety. Nitridation of the gate oxide may reduce the interface state density of the oxide in the upper half of the bandgap (near the conduction band). However, in p-type MOS devices in SiC, the oxide quality may be greatly affected by interface states in the lower half of the bandgap (i.e. near the valence band). Nitridation may undesirably increase the density of interface states in the lower half of the bandgap.

In order to reduce an interface state density near the valence band in the gate oxide layer 22, the oxide layer 22 may be formed using a dry-wet oxidation process as described above. In some embodiments, the dry-wet oxidation may be performed without exposing the oxide to nitrogen. The dry-wet oxidation process described herein may be effective at reducing midgap interface states and interface states in the lower half of the bandgap of the oxide layer, thereby providing an improved channel for a PMOS-based device.

Figure 4A:
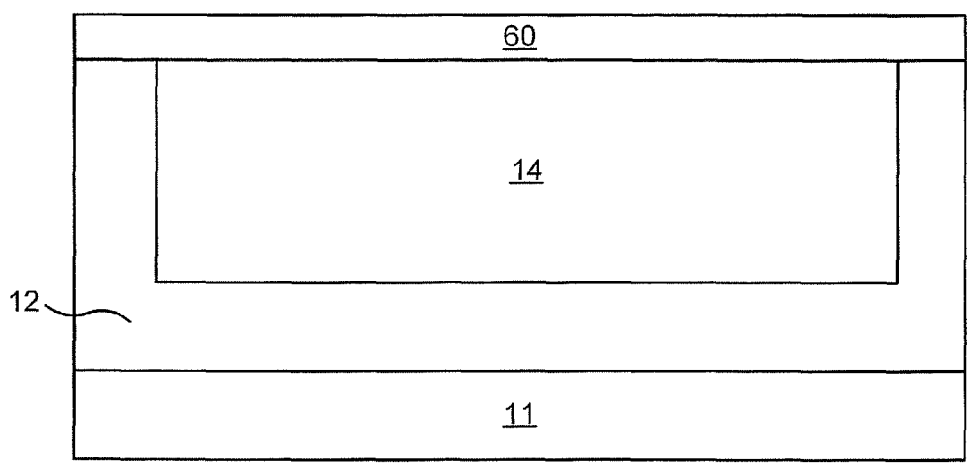
FIGS. 4A-4B are cross-sectional illustrations showing operations associated with formation of devices according to further embodiments of the invention.
Figure 4B:
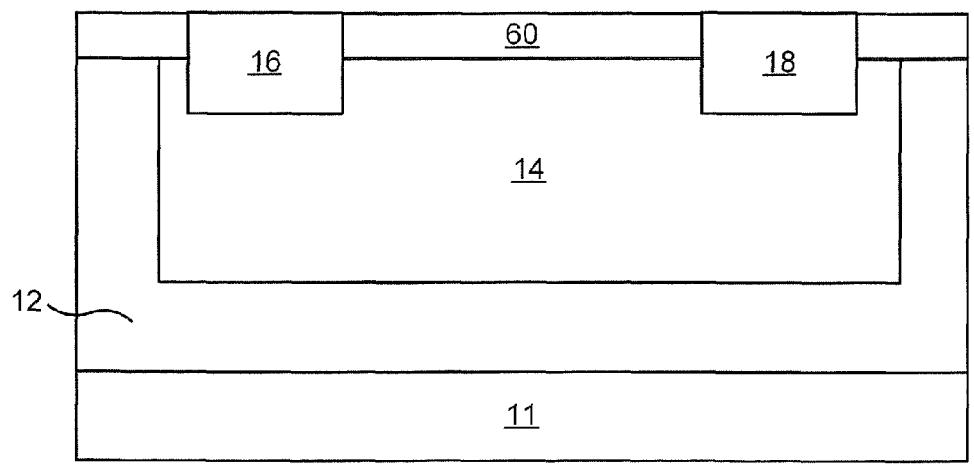

Further embodiments according to the invention are illustrated in FIGS. 4A-4B. As shown therein, after formation of the n-type well region 14 in the epitaxial layer 12 by ion implantation, a threshold adjustment layer 60 may be formed by epitaxial regrowth on the epitaxial layer 12. The threshold adjustment layer 60 may include about a layer of silicon carbide having a thickness of about 100 nm to about 500 nm doped with an acceptor at a concentration that provides an appropriate charge based on the thickness of the layer. The threshold adjustment layer 60 may be doped during epitaxial growth and/or may be doped via ion implantation after epitaxial growth. For example, the threshold adjustment layer 60 may be lightly doped with donor ions (i.e., n-type dopants) during epitaxial growth (e.g. at about $5\times10^{15}$ $cm^{-3}$ to about $1\times10^{16}$ $cm^{-3}$), and may be subsequently doped with acceptor ions, such as aluminum and/or boron, at a net concentration of about $1\times10^{16}$ $cm^{-3}$ to about $5\times10^{18}$ $cm^{-3}$ using ion implantation. In particular, the threshold adjustment layer may include about 300 nm of silicon carbide doped with acceptor ions, such as aluminum and/or boron, at a net concentration of about $1\times10^{17}$ $cm^{-3}$.

Referring to FIG. 4B, the p-type source and drain regions 16, 18 may be implanted through the threshold adjustment layer 60 into the n-type well region 14. The remainder of the device processing, including formation of the field oxide 25, the gate oxide 22, the gate contact 30 and the source and drain ohmic contacts 26, 28 may proceed as described above.

Figure 5:
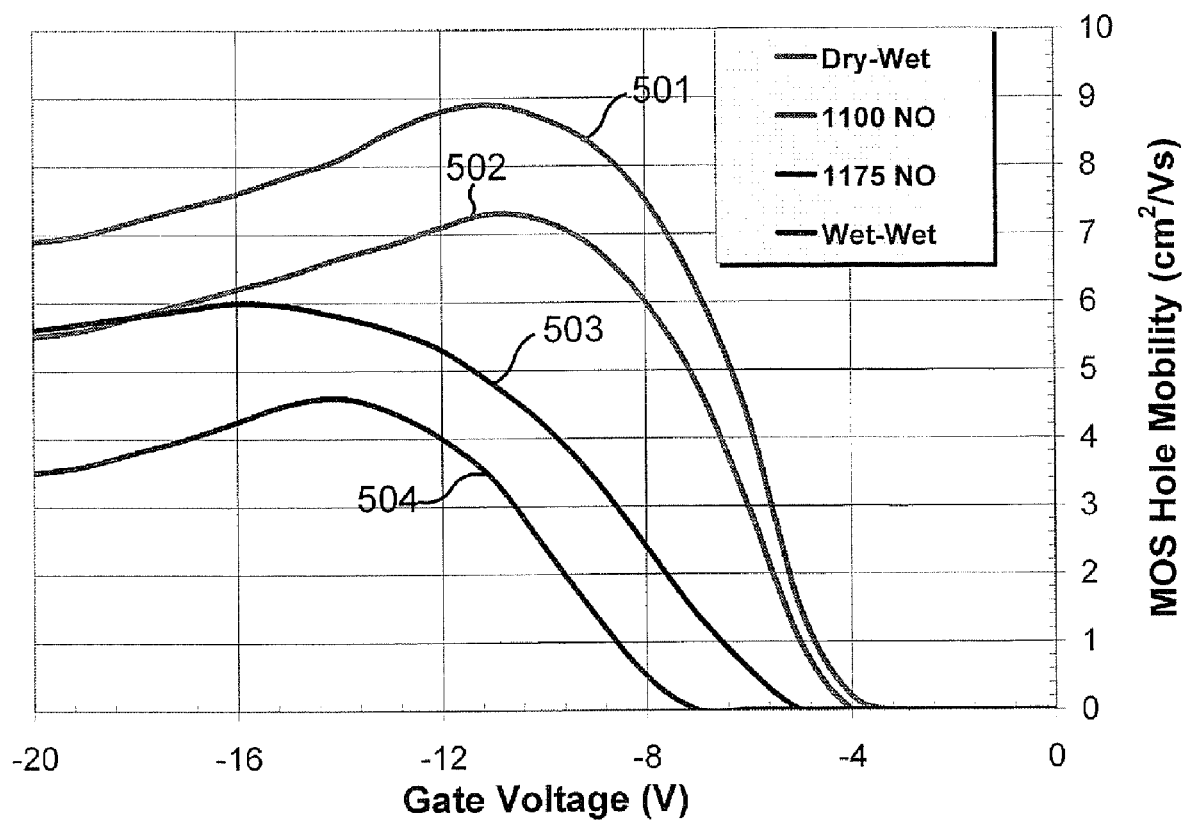
FIG. 5 is a graph of MOS hole mobility versus gate voltage for a lateral MOS device according to some embodiments of the invention.

A p-channel MOS device having an oxide layer formed as described above may exhibit improved turn-on and on-state mobility characteristics, as shown in FIG. 5. FIG. 5 is a graph of MOS hole mobility versus gate voltage for p-channel MOS test devices having gate oxide layers formed under different conditions on lightly doped channel regions. The hole mobility values shown in FIG. 5 were obtained from transconductance measurements of the devices. Curve 501 of FIG. 5 is a graph of MOS hole mobility versus gate voltage for a p-channel MOS device having a gate oxide layer fabricated using a dry-wet oxidation process as described above. Comparative examples are represented by curves 502-504. Curve 502 is a graph of MOS hole mobility versus gate voltage for a p-channel MOS device having a gate oxide layer formed using a dry-wet oxidation process as described above that has been annealed at about 1100° C. in an NO environment, while curve 503 is a graph of MOS hole mobility versus gate voltage for a p-channel MOS device having a gate oxide layer formed using a dry-wet oxidation process as described above that has been annealed at about 1175° C. in an NO environment. Curve 504 is a graph of MOS hole mobility versus gate voltage for a p-channel MOS device having a gate oxide layer grown using only wet oxidation. As shown in FIG. 5, the device having a gate oxide layer formed using a dry-wet oxidation process as described above, and that is not annealed in NO, has a lower turn-on voltage and a higher peak mobility than the device formed using only wet oxidation and the devices in which the oxide layer was annealed in NO.

Figure 6:
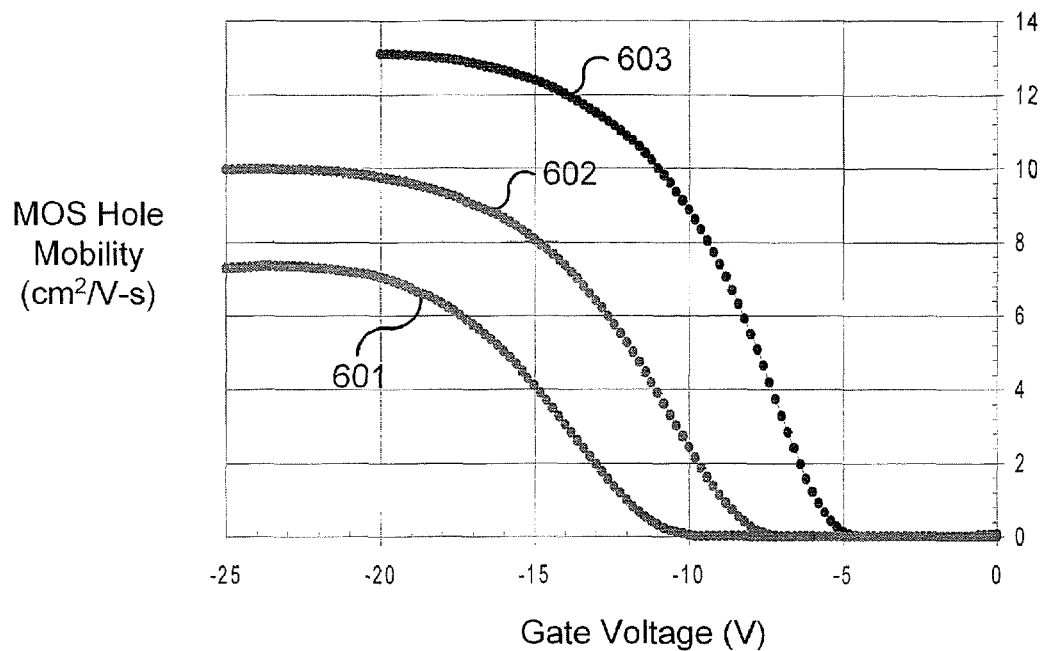
FIG. 6 is a graph of MOS hole mobility versus gate voltage for lateral MOS devices according to some embodiments of the invention.

FIG. 6, which is a graph of MOS hole mobility versus gate voltage for MOS device according to some embodiments of the invention, illustrates some possible benefits of the higher temperature anneal on a threshold-adjusted PMOS device formed in a heavily doped n-well. The hole mobility values shown in FIG. 6 were obtained from transconductance measurements of the devices. As shown in FIG. 6, a device annealed at about 1700° C. (Curve 601) has a lower hole mobility and a larger (i.e. more negative) turn-on voltage compared to a device annealed at about 1800° C. and formed without using pyrogenic wet oxidation (Curve 602), and a device annealed at about 1800° C. formed using pyrogenic wet oxidation (Curve 603). The highest electrically active dose (obtained by annealing at about 1800° C.) produces a mobility in excess of about 13 $cm^2$/V-s with a threshold voltage of about −5V.

Figure 7:
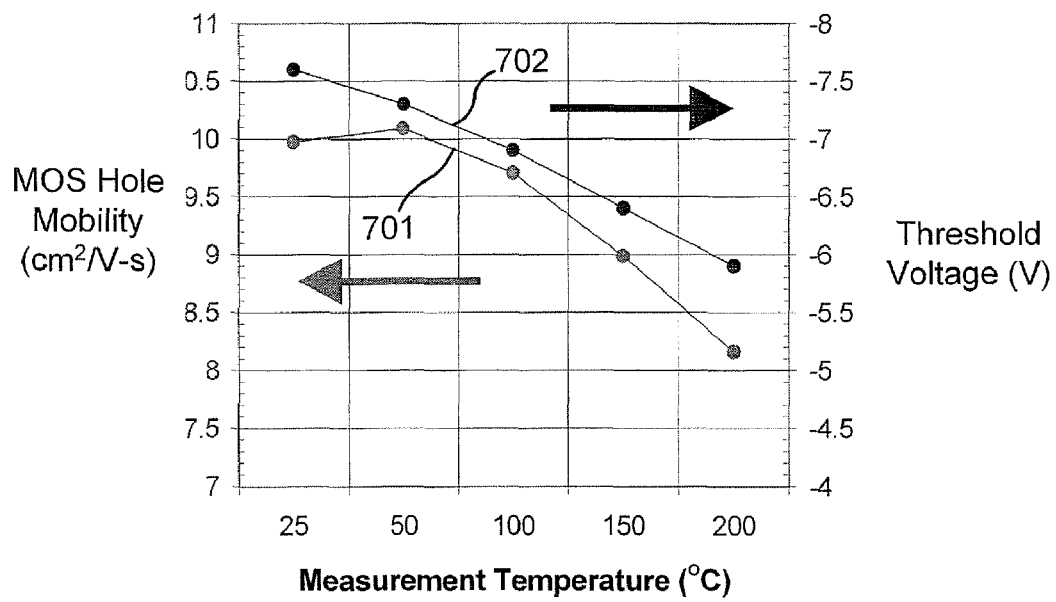
FIG. 7 is a graph of MOS hole mobility and threshold voltage as a function of measurement temperature for a lateral MOS device according to some embodiments of the invention.

The 1800° C.-annealed devices may continue to exhibit high mobility and enhancement mode operation even when operated at elevated temperatures, as shown in FIG. 7, which is a graph of MOS hole mobility (Curve 701) and threshold voltage (Curve 702) as a function of measurement temperature for a lateral MOS device according to embodiments of the invention. As shown in FIG. 7, performance of an 1800° C. annealed device (formed without pyrogenic wet oxidation) at elevated temperatures shows phonon-limited scattering and adequate threshold voltage for enhancement mode operation.

Figure 8A:
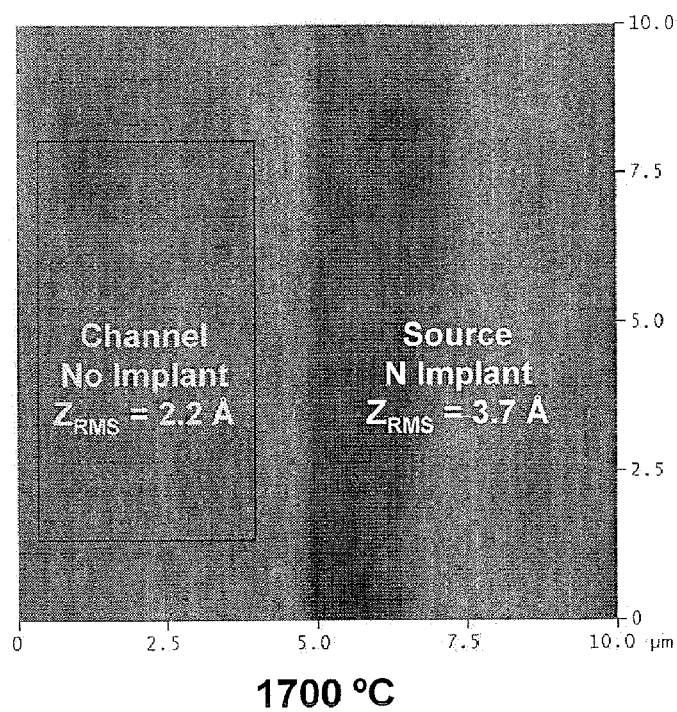
FIGS. 8A and 8B are atomic force microscopy (AFM) images of a SiC substrate after a high temperature graphite capped anneals at 1700° C. and 1800° C., respectively, according to some embodiments of the invention.
Figure 8B:
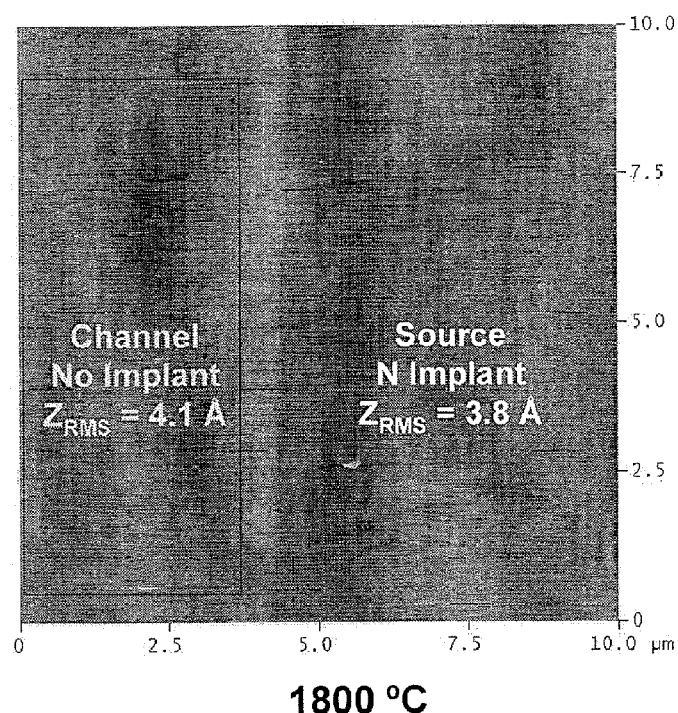

FIGS. 8A and 8B are atomic force microscopy (AFM) images of a SiC substrate after high temperature graphite capped anneals at about 1700° C. and about 1800° C., respectively. The AFM images show that the SiC substrate retains a substantially pristine morphology after anneals at about 1700° C. and 1800° C., which may be conducive to reliable device operation. Accordingly, graphite capping may enable higher temperature anneals than may otherwise be obtained. For example, anneals of silicon carbide epitaxial layers are typically limited to 1650° C. or below. However, some embodiments of the invention may provide anneal temperatures above 1650° C.

A SiC wafer typically has an RMS roughness $Z_{RMS}$ of about 0.2 nm prior to annealing. The 1700° C.-annealed wafer shown in FIG. 8A has $Z_{RMS}$ of 0.22 nm in an unimplanted channel region and 0.37 nm in the source (n-implanted) region. The 1800° C.-annealed wafer shown in FIG. 8B has $Z_{RMS}$ of 4.1 Å in an unimplanted channel region and 0.38 nm in the source (n-implanted) region.

Figure 10:
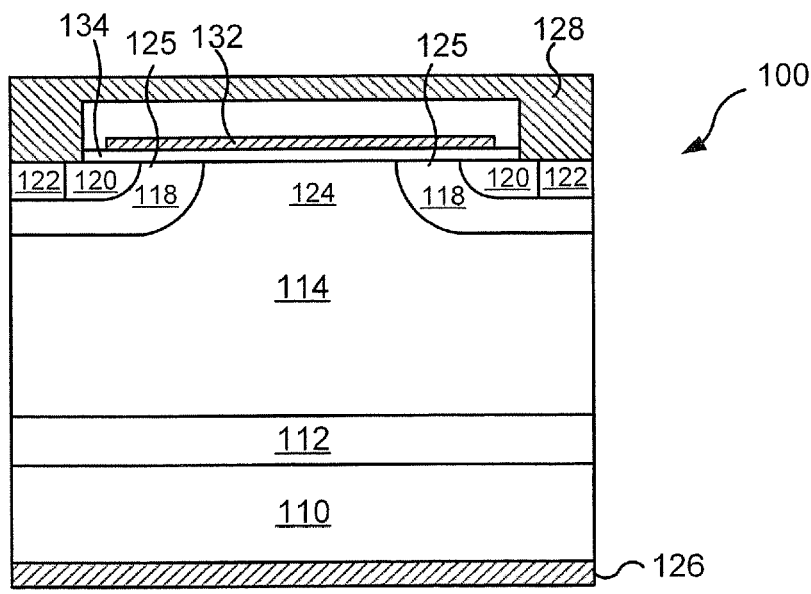
FIG. 10 is a cross-section of an insulated gate bipolar transistor (IGBT) device according to some embodiments of the invention.

A unit cell 100 of p-channel planar IGBT structure according to some embodiments of the invention is shown in FIG. 10. A planar device structure, such as the structure of the device 100 shown in FIG. 10, may provide process simplification and/or enhanced device reliability. However, other device structures may be advantageously employed.

The device 100 of FIG. 10 includes a p-type buffer layer 112 and a p-drift epitaxial layer 114 on an n-type, 8° off-axis 4H—SiC substrate 110. The p-drift layer 114 may have a thickness of about 100 μm to about 120 μm, and may be doped with p-type dopants at a doping concentration of about $2\times10^{14}$ $cm^{-3}$ to about $6\times10^{14}$ $cm^{-3}$ for a blocking capability of about 10 kV. The p-type buffer layer 112 may have a thickness of about 1 to about 2 μm and may be doped with p-type dopants at a doping concentration of about $1\times10^{17}$ cm$^{-3}$. The p-type buffer layer 112 may be provided as a channel stop layer to prevent punch-through.

The structure further includes n+ well regions 118 and p+ emitter regions 120 that may be formed by selective implantation of, for example, nitrogen and aluminum, respectively. The junction depth of the n+ well regions 118 may be about 0.5 µm. The structure 100 further includes n+ contact regions 122 that extend from a surface of the drift layer 114 into the n+ well regions 118. A guard-ring based termination (not shown) may be provided around the device periphery.

A JFET region 124 may be formed, for example, by implantation of aluminum, in the drift layer 114 between adjacent n+ well regions 118. The JFET region 124 may be implanted with p-type dopants to reduce the JFET resistance from the adjacent n+ well regions. In particular, the JFET implantation dose may be selected to reduce the JFET resistance while keeping implant damage at an acceptable level. In some embodiments, the JFET implantation may be performed at a dose sufficient to provide a dopant concentration of about $1\times10^{16}$ cm$^{-3}$ in the JFET region. The JFET region may, for example, be formed by an epitaxial growth process.

In some embodiments, a threshold adjustment region may be provided in the MOS channel region 125 of the device 100. In particular, a p-type dopant, such as aluminum, may be implanted into the channel region 125 of the n+ well regions 118 between the p+ emitter regions 120 and the JFET region 124 to modify the threshold voltage and/or to improve the inversion channel mobility. The threshold adjustment region may be formed using ion implantation and/or epitaxial regrowth techniques. For example, after an activation anneal of the n+ well regions 118 and JFET implants, a threshold adjustment region may be grown by epitaxial regrowth. In that case, the threshold adjustment region may also permit formation of a deep n-well that may prevent latch-up by lifting the p-type emitter implants to the threshold adjustment region regrowth layer. The deep n-well may cause a lower n-well resistance and may increase the device latch-up current.

The threshold adjustment region may be formed by implantation of p-type dopant ions with a dose of from about $5\times10^{11}$ cm$^{-2}$ to about $5\times10^{13}$ cm$^{-2}$ depending on the amount of threshold adjustment required. In particular embodiments, a threshold adjustment implant of aluminum may be performed at a dose of $3\times10^{12}$ cm$^{-2}$. The implant energy may be selected to position the channel at the surface of the device or at a desired distance from the surface. In some embodiments, the threshold adjustment implant may be performed with an implant energy of at least about 25 keV. In some embodiments, the threshold adjustment may include multiple implants. In particular embodiments, the threshold adjustment may be accomplished by implanting aluminum ions with a dose of $8.4\times10^{11}$ cm$^{-1}$ at 45 keV, a dose of $1.12\times10^{12}$ cm$^{-2}$ at 85 keV, a dose of $1.52\times10^{12}$ cm$^{-2}$ at 140 keV, a dose of $1.92\times10^{12}$ cm$^{-2}$ at 210 keV, and a dose of $4.6\times10^{12}$ cm$^{-2}$ at 330 keV, for a total aluminum dose of $1\times10^{13}$ cm$^{-2}$. The threshold adjustment region may be formed by p-type epitaxial growth, which may provide a high channel mobility and/or a long carrier lifetime.

All of the implanted dopants may be activated by annealing the structure at a temperature of about 1650° C. or greater with a silicon over-pressure and/or covered by an encapsulation layer such as a graphite film. A high temperature anneal may damage the surface of the silicon carbide epitaxy. In order to reduce such damage, a graphite coating may be formed on the surface of the device. Prior to annealing the device to activate the implanted ions, a graphite coating may be applied to the top/front side of the structure in order to protect the surface of the structure during the anneal. The graphite coating may be applied by a conventional resist coating method and may have a thickness of about 1 µm. The graphite coating may be heated to form a crystalline coating on the drift layer 114. The implanted ions may be activated by a thermal anneal that may be performed, for example, in an inert gas at a temperature of about 1650° C. or greater. In particular the thermal anneal may be performed at a temperature of about 1700° C. in argon for 5 minutes. The graphite coating may help to protect the surface of the drift layer 114 during the high temperature anneal.

The graphite coating may then be removed, for example, by ashing and thermal oxidation.

After implant annealing, a field oxide (not shown) of silicon dioxide having a thickness of about 1 µm is deposited and patterned to expose the active region of the device.

A gate oxide layer 134 may be formed by a gate oxidation process, with a final gate oxide thickness of 400-600 Å.

In particular, the gate oxide 134 may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour. The wet $O_2$ oxide anneal may be performed at a temperature of about 950° C. or less for a time of at least about 1 hour. The temperature of the wet $O_2$ anneal may be limited to discourage further thermal oxide growth at the SiC/SiO$_2$ interface, which may introduce additional interface states. In particular, the wet $O_2$ anneal may be performed in wet °2 at a temperature of about 950° C. for about 3 hours. The resulting gate oxide layer may have a thickness of about 500 Å.

After formation of the gate oxide 134, a polysilicon gate 132 may be deposited and doped, for example, with boron followed by a metallization process to reduce the gate resistance. Al/Ni contacts may be deposited as the p-type ohmic emitter contact metal 128, and Ni as the n-type collector contact metal 126. All contacts may be sintered in a Rapid Thermal Annealer (RTA), and thick Ti/Au layers may be used for pad metals.

Silicon carbide p-channel MOS structures according to some embodiments of the invention may exhibit reduced threshold voltages and/or higher on-state hole mobility compared to conventional silicon carbide p-channel MOS structures. Accordingly, p-channel MOS structures according to some embodiments of the invention may be utilized in any semiconductor device having a p-channel MOS structure, such as p-channel MOSFETs and/or p-channel insulated gated bipolar transistors (P-IGBTs).

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a p-channel MOS device in silicon carbide, comprising:
    forming an n-type well in a silicon carbide layer;
    implanting p-type dopant ions to form a p-type region in the n-type well at a surface of the silicon carbide layer, the p-type region at least partially defining a channel region in the n-type well adjacent the p-type region;
    forming a p-type threshold adjustment region in the channel region by implanting p-type dopants into the channel region;
    annealing the implanted ions in an inert atmosphere at a temperature greater than 1650° C.;
    forming a gate oxide layer on the channel region; and
    forming a gate on the gate oxide layer;
    wherein the silicon carbide layer comprises a p-type silicon carbide layer including a JFET region adjacent to the n-type well, and wherein the p-type region comprises a p-type emitter region spaced apart from the JFET region and defining the channel region between the p-type emitter region and the JFET region.

2. The method of claim 1, wherein the silicon carbide layer comprises an n-type silicon carbide layer, and wherein the p-type region comprises a p-type source region, the method further comprising implanting p-type dopant ions in the n-type well to form a p-type drain region spaced apart from the p-type source region and defining the channel region between the p-type source region and the p-type drain region.

3. The method of claim 1, further comprising:
    forming a graphite coating on the silicon carbide layer after implanting the p-type dopant ions, wherein annealing the implanted ions comprises annealing the silicon carbide layer and the graphite coating; and
    removing the graphite coating after annealing the implanted ions.

4. The method of claim 3, further comprising crystallizing the graphite coating before annealing the implanted ions.

5. The method of claim 3, wherein annealing the implanted ions comprises annealing the implanted ions at a temperature greater than 1700° C.

6. The method of claim 3, wherein annealing the implanted ions comprises annealing the implanted ions at a temperature greater than 1800° C.

7. The method of claim 1, wherein forming the gate oxide layer comprises forming the gate oxide layer in dry $O_2$, the method further comprising annealing the gate oxide layer in wet $O_2$.

8. The method of claim 7, wherein forming the gate oxide layer comprises forming the gate oxide layer in dry $O_2$ at a temperature less than or equal to about 1200° C.

9. The method of claim 7, further comprising annealing the gate oxide layer in an inert atmosphere at a temperature less than or equal to about 1200° C. after forming the gate oxide layer and before annealing the gate oxide layer in wet $O_2$.

10. The method of claim 7, wherein annealing the gate oxide layer in wet $O_2$ comprises annealing the gate oxide layer in wet $O_2$ at a temperature less than or equal to about 950° C.

11. The method of claim 10, wherein annealing the gate oxide layer in wet $O_2$ comprises annealing the gate oxide layer in wet $O_2$ for at least one hour.

12. The method of claim 7, wherein annealing the oxide layer in wet $O_2$ comprises generating pyrogenic steam in a pyrogenic chamber, supplying the pyrogenic steam to an anneal chamber, and annealing the oxide layer in the anneal chamber.

13. The method of claim 12, wherein generating pyrogenic steam comprises heating the pyrogenic chamber, supplying hydrogen and oxygen gas to the pyrogenic chamber, and combusting the hydrogen gas and the oxygen gas to form the pyrogenic steam, wherein the hydrogen gas and the oxygen gas are supplied to the pyrogenic chamber at a molecular ratio of hydrogen to oxygen of about 1.8 or more.

14. The method of claim 1, wherein forming the threshold adjustment region comprises implanting p-type dopant ions into the channel region to adjust a threshold of the channel region.

15. The method of claim 14, wherein implanting p-type dopant ions into the channel region comprises implanting p-type dopant ions into the channel region at a dose of about $5\times10^{11}$ cm$^{-2}$ to about $5\times10^{13}$ cm$^{-2}$.

16. The method of claim 14, wherein implanting p-type dopant ions into the channel region comprises implanting p-type dopant ions into the channel region at an implant energy of at least about 25 keV.

17. The method of claim 1, wherein forming a threshold adjustment region comprises forming an epitaxial layer on the silicon carbide layer and doping the epitaxial layer with a p-type dopant, wherein forming the p-type region comprises implanting p-type dopant ions into the epitaxial layer.

18. The method of claim 17, wherein forming the epitaxial layer comprises doping the epitaxial layer with donor ions at a doping concentration of about $5\times10^{15}$ cm$^{-3}$ to about $1\times10^{16}$ cm$^{-3}$ during epitaxial growth, and then implanting p-type dopant ions into the epitaxial layer to provide a net doping concentration of about $1\times10^{16}$ cm$^{-3}$ to about $5\times10^{18}$ cm$^{-3}$ in the epitaxial layer.

19. The method of claim 18, wherein the epitaxial layer is formed to have a thickness of about 100 nm to about 500 nm, and wherein doping the epitaxial layer with a p-type dopant comprises doping the epitaxial layer with a p-type dopant to have a net concentration of about $1\times10^{16}$ cm$^{-3}$ to about $5\times10^{18}$ cm$^{-3}$.

20. A method of forming a p-channel MOS device in silicon carbide, comprising:
    forming an n-type well in a silicon carbide layer;
    implanting p-type dopant ions to form a p-type region in the n-type well at a surface of the silicon carbide layer, the p-type region at least partially defining a channel region in the n-type well adjacent the p-type region;
    forming a p-type threshold adjustment region in the channel region by implanting p-type dopants into the channel region;
    forming a graphite coating on the silicon carbide layer after implanting the p-type dopant ions;
    crystallizing the graphite coating;
    annealing the implanted ions in an inert atmosphere at a temperature greater than 1650° C., wherein annealing the implanted ions comprises annealing the silicon carbide layer and the crystallized graphite coating after crystallizing the graphite coating;
    removing the graphite coating after annealing the implanted ions;
    forming a gate oxide layer on the channel region; and
    forming a gate on the gate oxide layer.

* * * * *